United States Patent [19]

de Weck

[11] Patent Number: 4,668,919
[45] Date of Patent: May 26, 1987

[54] HIGH SPEED OPERATIONAL AMPLIFIER

[75] Inventor: Lionel M. de Weck, Santa Clara, Calif.

[73] Assignee: Advanced Micro Devices, Inc., Sunnyvale, Calif.

[21] Appl. No.: 831,020

[22] Filed: Feb. 19, 1986

[51] Int. Cl.4 .............................................. H03F 3/45
[52] U.S. Cl. .................................... 330/253; 330/255; 330/257; 330/311
[58] Field of Search ............... 330/253, 255, 257, 263, 330/264, 311

[56] References Cited

U.S. PATENT DOCUMENTS 3,921,090  11/1975  Wheatley, Jr. et al. ............. 330/257

FOREIGN PATENT DOCUMENTS 2154693  5/1973  Fed. Rep. of Germany ...... 330/263
3012919  10/1980  Fed. Rep. of Germany ...... 330/263
0023246  2/1977  Japan ................................... 330/257
0115048  9/1979  Japan ................................... 330/264

OTHER PUBLICATIONS

Ahuja et al., "A Programmable CMOS Dual Channel Interface Processor for Telecommunications Applications", *IEEE Journal of Solid-State Circuits*, vol. SC-19, No. 6, Dec. 1984, pp. 892-899.

Hosticka, "Dynamic CMOS Amplifiers", *IEEE Journal of Solid-State Circuits*, vol. SC-15, No. 5, Oct. 1980, pp. 887-894.

*Primary Examiner*—James B. Mullins
*Attorney, Agent, or Firm*—Patrick T. King; Davis Chin

[57] ABSTRACT

A high speed low power linear two micron CMOS operation amplifier comprises an input differential amplifier stage having feedback current mirror loads connected to a four vertically stacked transistor cascode output stage. Current domain operation of the amplifier enable fast operation through current mirror arrangements internal to the amplifier. Pass transistors of the cascode stage are dynamically biased providing the amplifier with single gain stage reducing the need for large compensation capacitors while improving the dynamic range of the output signal. The gain of amplifier is ninety decibels with a unit gain frequency bandwidth of fifty megahertz and with low power dissipation at two milliwatts.

9 Claims, 2 Drawing Figures

HIGH SPEED OPERATIONAL AMPLIFIER

CROSS REFERENCE

Cross reference is here made to applicant's copending patent applications entitled "High Speed Comparator with Controlled Hysteresis" serial number: 831,039, filed on: 2/19/86, and "High Speed Full Differential Amplifier with Common Mode Rejection", serial number: 831,012, filed on: 2/19/86.

BACKGROUND

The present invention relates to electronics and electronic circuits. More specifically, the present invention relates to amplifier circuits and operational amplifiers.

Heretofore operational amplifier circuits have been designed in a wide variety of configurations and fabricated by a wide variety of process technologies. One of the most significant amplifiers is the differential amplifier having two inputs and an output. The voltage potential difference between the two inputs is amplified and presented as an output signal at an output of the differential amplifier.

One of the most significant uses of the differential amplifier is controlled amplification through negative feedback. Negative feedback occurs when an output signal of the amplifier is fedback to the negative input. Negative feedback of the differential operational amplifier provides for predictable controlled close-loop amplification over the bandwidth of the amplifier.

The designers of operational amplifiers have continually strived for better performing amplifiers. Input offset currents, input offset voltages, bandwidth, gain, input impedance, output impedance, inter alia, are parameters that are considered by those who select differential amplifiers for particular applications. Gain and bandwidth are the two most commonly considered parameters. As the gain of the differential operational amplifiers increases, the circuit using a differential operational amplifier with negative feedback becomes more precise and predictable. The higher the bandwidth, the higher the operating frequency. The gain-bandwidth product is a combined parameter of usefulness of an amplifier. These and other parameters are defined by the inherent design of the differential amplifier.

Typical differential amplifier designs include a differential input stage, which is a gain stage, connected to an output gain stage with a compensation capacitor therebetween. The gain of the differential amplifier is the product of the gain of the differential input stage and the gain of the output gain stage. The output gain stage is then followed by an output stage. The output stage provides a low output impedance desired in many circuit applications. MOTOROLA Inc. manufactures a typical commercially available CMOS operational amplifier which is the MC14573 operational amplifier. The gain for a conventional two micron linear CMOS amplifier may be, for example, fifty thousand.

Three different operational amplifiers, two in CMOS technology and the other in bipolar technology, having differential inputs stages, compensation capacitors and outputs gain stages having conventional designs are disclosed in U.S. Pat. Nos. 4,464,588 (hereinafter 588), 4,383,223 (hereinafter 223) and 4,477,780, (hereinafter 780) all of which are here incorporated by reference as there fully setforth. Differing processes, for examples, CMOS and bipolar, may use substantially similar designs.

223 discloses a CMOS operational amplifier having conventional current mirror loads in the input differential stage, and an output push-pull stage with a compensation capacitor connected therebetween. 588 discloses a CMOS amplifier having the positive input connected to a ground reference and having its output negatively fedback to the negative input thereby forming a voltage reference circuit. 780 discloses a bipolar amplifier with multiple output follower stages each of which is negatively fedback to the negative input with the positive input connected to a ground reference thereby forming a multiple voltage reference circuit. Though the applications of the operational amplifier may be different, all three circuits include a conventional operational amplifier having a differential input stage, a compensation capacitor and an output gain stage.

The compensation capacitor between the two gain stages produces an increasing gain attenuation above a predetermined frequency which is substantially lower than the natural frequency of the operational amplifier, at which natural frequency the amplifier obtains additional 180 phase shift between its inputs and its output. A 180 degrees of phase shift of the negative feedback connection when added to the additional 180 of phase shift associated with the natural frequency, can cause the amplifier to become unstable and oscillate by virtue of positive feedback associated with 360 degrees of phase shifting between the inputs and the output.

The gain attenuation caused by the compensation capacitor is so severe at the high natural frequency of the amplifier, that the gain of the amplifier is substantially less than one so that only a portion of the output signal is positively fedback thereby preventing unstable oscillations.

In classical two stage amplifiers, the compensation capacitor is positioned between the two gain stages perfecting a Miller effect. The Miller effect, enabled by feedback through the capacitor from the output of the output gain stage to the output of the input stage, provides equivalent capacitive compensation corresponding to the gain of the first stage multiplied by the capacitance of the compensation capacitor. This multiplication factor reduces the required capacitance thereby reducing the size of a corresponding capacitor. Miller effect compensation techniques are generally well known in the art.

223 discloses a compensation capacitor twenty. 877 discloses a compensation capacitor twenty six. 780 discloses compensation capacitor fourteen. Even though the Miller effect reduces the size of the compensation capacitor, sufficient compensation still requires relatively large capacitance correspondingly requiring large semiconductor area and therefore decreases the yields and increases the cost of semiconductor devices. Also, the capacitors, as they are intended to do, decrease the bandwidth of the amplifier, for example, to five megahertz. Moreover, large capacitors tend to pass large currents which in turn require more power for a power source thereby dissipating more power in the amplifier. Conventional CMOS amplifiers, for example, The 14573 linear CMOS amplifier dissipates approximately twenty milliwatts.

The input differential stage generally includes two coupled transistors connected to a current source drawing a constant current through the coupled transistors. The sum of the current through each equals the constant current. The current through the coupled transistors will generally follow a hyperbolic tangent curve permitting rapid current change with little voltage change at the inputs of the transistors providing a high voltage to current conversion in the input differential stage.

A modern means of obtaining a constant current is by use of well known current mirrors. Typically, in a current mirror, a constant current is established in a current path transistor a stacked resistor both connected in series between power supply references. The current which flows therethrough is generally equal to the difference between the power supply references divided by the sum of the resistances of the resistor and the current path transistor. A mirror transistor is then connected to the current path transistor, such that both transistors conduct the same quantity of current. A conducting terminal of the mirror transistor then acts as the constant current source varying its transconductance to maintain a constant current therethrough.

An improved current mirror is the feedback current mirror commonly known as the Wilson current mirror. A commercially available part manufactured by TEXAS INSTRUMENTS called the TL010I or TL010C "Adjustable-Ratio Current Mirrors" comprising a plurality of Wilson current mirror circuits.

588 discloses a feedback current mirror comprising transistors twenty nine, thirty and thirty one. Transistor thirty one has a gate terminal which is fedback and connected to the input transistor twenty nine. The feedback connection and the use of transistor thirty one improves the performance of the current mirror by reducing second order effects of output voltages of the current mirror, which effect disadvantageously changes the current of a constant current mirror. 588 also discloses conventional current mirrors, for example, the circuit comprising transistors thirty three and seventeen, and, for example, the circuit comprising transistors eighteen and nineteen.

223 discloses a conventional current mirror comprising transistor six providing constant current to coupled transistors eight and twelve. Also, transistors ten and fourteen therein form a conventional current mirror load of the coupled transistors providing a voltage output characterized by large voltage fluxion.

780 discloses two emitter coupled PNP transistors eleven and twelve connected to a fifteen microampere constant current source, while 588 discloses source coupled P channel MOS transistors connected to a constant current source providing a constant current I.

588 also discloses a current mirror comprising current path transistors twenty eight and twenty nine, establishing a constant current through transistors thirty three, thirty two and thirty, which constant current is then established in a mirror transistor seventeen drawing a constant current through coupled transistors fourteen and fifteen. These are common current mirror arrangements.

All three circuits of 223, 780 and 588 have mirror current loads in the input differential stage for providing voltage gain in the input differential stage. For example, in 588, transistor nineteen reflects the current in transistor eighteen, and transistor nineteen provides for high voltage gain at its drain terminal by virtue of a high impedance into that drain terminal.

Some input differential stages provide for voltage to current amplification using current mirror active loads. For example, a current mirror load having a first and a second MOS transistor having their source connected to a positive power source, having their gate terminals connected together and connected to the output of an input transistor, while the drain of the first transistor is also connected to output terminal of the input transistor. The drain terminal of the second transistor acts as a current source at its drain terminal reflecting the current in the first transistor which in turn reflects the current through the input transistor. Hence, a voltage change at the gates of the input transistors produces a current reflection at the drain terminal of the second transistor.

One problem associated with this voltage to current reflection configuration of the input differential stage using CMOS current mirror active loads, is the second order effect of small signal voltage levels at the drain terminal of the second transistor, which drain terminal acts as a current source driving other cascaded circuits. The second order effect of a small signal voltage superimposed at the output of the second transistor causes a corresponding fluxion of the output current by virtue of the output transistors having a drain current versus drain to source voltage curve which has a slope corresponding to an output impedance. More simply, a change in output voltage of this current source causes a change in the current value. This change in current does not occur in ideal current sources. This second order effect slows down the operation of the input differential stage because the current mirror load requires time to react to the superimposed voltage change causing an unwanted temporary change in the output current.

Another problem associated with conventional two stage voltage gain amplifiers are parasitic effects in which large varying voltage signals produce current flow in parasitic capacitance thereby reducing the bandwidth of the amplifier. Hence, amplifiers which operate on internal voltage signals with large amplitude variation tend to have lower slew rates and bandwidths.

Some input differential amplifiers stages have been connected to CMOS cascode output stages which provide high gain and which typically comprises four vertically stacked transistors connected between a positive voltage reference and a negative voltage reference. The top and bottom transistors act as signal transistors while the middle two act as pass transistors. The two pass transistors have their gate terminal connected to a bias reference voltage and pass a signal from a respective signal transistor to the output at the connection between the two pass transistors. The two signal transistors have their gates connected to two differential voltage signals.

One problem associated with the use of pass transistors in the cascode stage is the presence of two transistors between the output and a power reference thereby limiting the dynamic range of the amplifier output voltage signal. Consequently, the amplifiers typically require an additional high voltage power supply in a five volt logic system.

Another problem associated with the use of pass transistors in the cascode stage is that the bias is fixed to a voltage reference thereby preventing variable bias. The slew rates and settling time of high speed signals are limited by fixed bias pass transistors. Conventional two stage amplifiers with large voltage fluxion using fixed bias pass transistors in the cascode stage typically have slow slew rates of ten volts per microsecond and slow one percent settling times of 300 nanosecond, for example, in response to a two volt step.

Though heretofore designs of conventional operational amplifiers were improvements over previous designs, those skilled in the art strive ever more to yet further improve upon those designs. The foregoing amplifiers having the corresponding disadvantages or design limitations are further improved upon using teachings of the present invention.

SUMMARY

An object of the present invention is to provide an amplifier having an improved gain bandwidth product.

Another object of the present invention is to provide an amplifier having an improved dynamic output range respecting given power supply references.

Yet another object of the present invention is to provide an amplifier having a single voltage gain stage reducing the need for large compensation capacitors.

A further object of the invention is to provide an input differential stage which reduces second order effects of current mirror source loads.

Yet a further object of the present invention is to provide a voltage to current input differential amplifier stage driving a dynamically biased cascode output stage for improving the speed and the dynamic range of the amplifier while reducing power dissipation.

The present invention, including various improved features, is embodied in an high speed amplifier fabricated by a two micron CMOS process. The amplifier, with improved performance characteristics, may be used in a wide variety of circuit applications.

The amplifier comprises an input differential stage having feedback current mirror loads, which input differential stage has two sets of outputs. Each set of outputs comprises a voltage signal output and a current signal output. The four outputs of the input stage are respectively connected through a current mirror stage to a four transistor stacked cascode output stage having two signal transistors respectively connected to the voltage outputs of the input stage and having two pass transistors respectively connected to the current outputs of the input stage. The input differential stage combines with the cascode output stage forming a single gain stage.

The use of the fedback current mirrors as active loads in the input differential stage provide the current source outputs which are relatively insensitive to second order effect of superimposed voltage levels at their output thereby propagating fast current signals in the current domain to the pass transistors of the cascode output stage. Consequently, the pass transistors are dynamically biased with fast current signals which tends to improve the speed and gain of the amplifier. The dynamic bias of the pass transistor also tends to reduce the required DC voltage drops between the power references and the output of the amplifier thereby improving the dynamic range of the output given particular power references of a power source.

The single gain stage structured by combining the input differential stage having current domain output signals and a dynamically biased cascode output stage, extends the natural frequency of the amplifier so that relatively small compensation capacitors can be optionally used. The unity gain bandwidth of the amplifier is increased to fifty megahertz while retaining a high amplifier gain of fifty thousand. The amplifier uses current mirror arrangements conducting when necessary large current signal fluxion rather than large voltage signal fluxion.

The single gain stage structure provides large current variations rather than large voltage signal variations thereby reducing the Miller and parasitic effects and thereby inherently improving the speed of the operational amplifier.

The amplifier circuit operates primarily in the current domain. Voltage signals primarily appear at high impedance terminals of all the transistors so that current and the corresponding power dissipation is used only upon demand thereby making the amplifier more power efficient.

The amplifier circuit provides many improved performance characteristics and resulting advantages over of heretofore amplifier designs. These and other advantages will become more apparent from the following description of the preferred embodiment and from the accompanying drawings.

For further understanding of the herein disclosed invention, reference is made to applicant's copending patent applications entitled "High Speed Comparator with Controlled Hysteresis" Ser. Nos. 831,039, filed on: 2/19/86, and "High Speed Full Differential Amplifier with Common Mode Rejection", 831,012, filed on: 2/19/86, both of which are here incorporated by reference as there fully set forth.

DRAWING DESCRIPTION

PREFERRED EMBODIMENT

Figure 1:
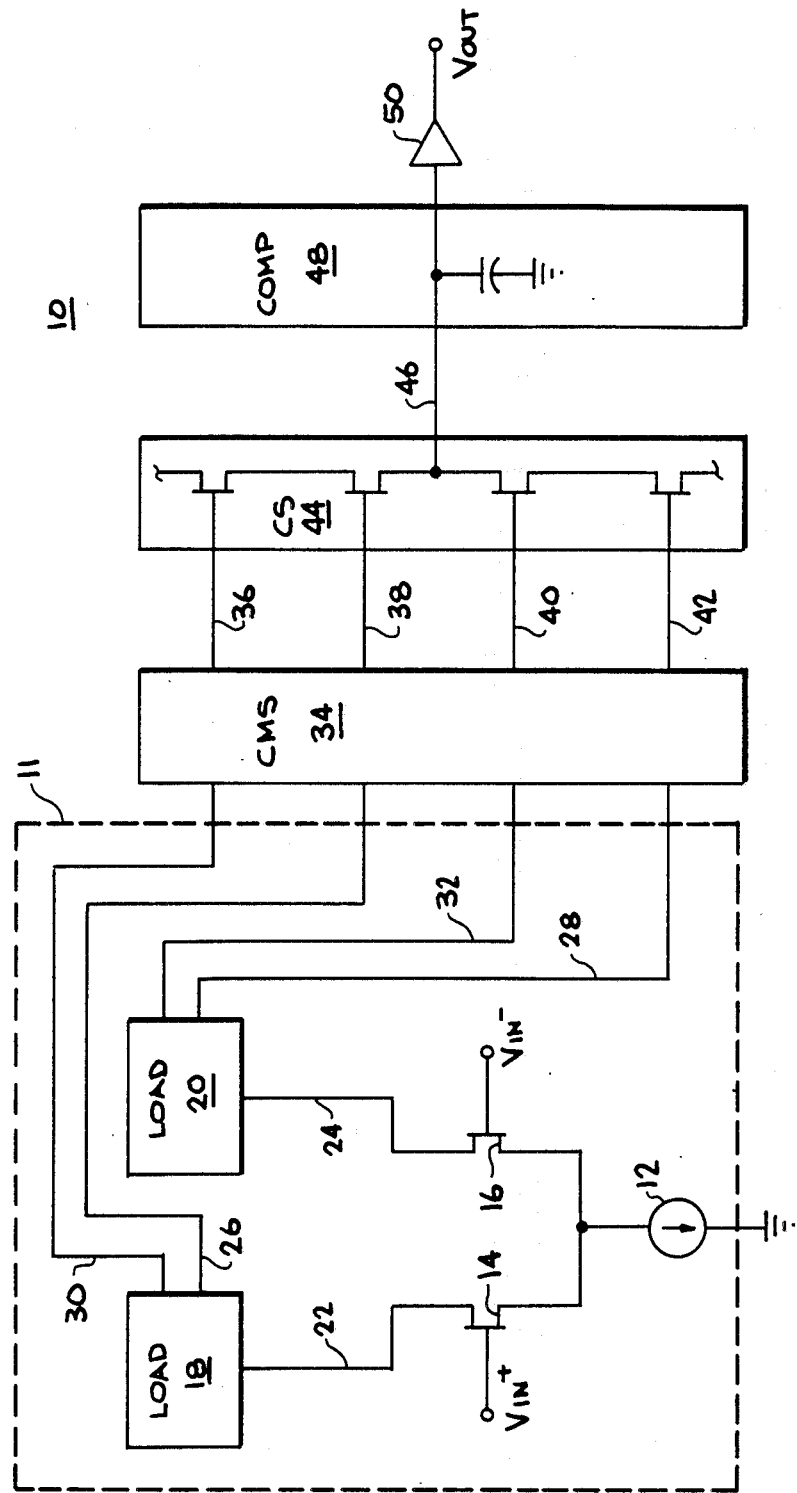
FIG. 1 is a block diagram of a high speed operational amplifier of the present invention.

Referring to FIG. 1, a differential amplifier 10 amplifies a differential voltage signal between a pair of inputs terminal Vin+ and Vin− and provides an output voltage signal at an output terminal Vout. The output signal is equal to a gain of the amplifier 10 multiplied by the difference between the voltage applied to the Vin+ terminal minus the voltage applied to the Vin− terminal.

The differential amplifier 10 has an input differential stage 11 comprising a constant current source 12, two coupled transistors 14 and 16 and two feedback current mirror loads 18 and 20. The current into the input terminals Vin+ and Vin− is negligible. The constant current source 12 draws a constant current through the coupled transistors 14 and 16 which in turn draw the same constant current through the loads 18 and 20. The current through transistor 14 equals the current through the load 18 and the current through transistor 16 equals the current through the load 18.I The sum of the current flowing through transistors 14 and 16 equals the sum of the current flowing through loads 18 and 20 on lines 22 and 24, respectively, which sum equals the constant current of the constant current source 12. As the voltage difference varies between the Vin+ terminal and the Vin− terminal, the current varies through the respective transistors 14 and 16, respective lines 22 and 24 and respective loads 18 and 20.

The loads 18 and 20 have a current output on lines 26 and 28, respectively, and have voltage output lines 30 and 32, respectively. Current and voltage signals on output lines 26, 28, 30 and 32 are connected to a current mirror stage 34.

The current mirror stage 34 provides four respective voltage signals on lines 36, 38, 40 and 42 which synchronously vary are presented to four respective cascode transistors in a cascode stage 44. The current mirror stage 34 level shifts, converts and communicates of voltage and current signals through current mirror arrangements among the transistors of loads 18 and 20, the current mirror stage 34 and the cascode stage 44.

The cascode stage 44 combines the four voltage signals and provides an amplified output signal on line 46 which is optionally connected to compensation capacitors in a compensation stage 48. The line 46 is optionally connected to a voltage follower stage 50 buffering the signal on line 46 and presenting a buffered amplified output signal onto the output terminal Vout.

In amplifying operation, coupled input transistors 14 and 16 cause current changes through loads 18 and 20 as the differential input voltage changes between the terminals Vin+ and Vin−. The loads 18 and 20 produce corresponding changing current and voltage signals which are reflected by the current mirror stage 34 presenting synchronously varying voltage signals to the cascode stage 44. Because the current through the coupled input transistors 14 and 16 equal the current through the loads 18 and 20, the input differential stage 11 does not provide voltage gain as do conventional operational amplifiers.

More simply, the loads 18 and 20 combine with the cascode stage 44 providing a single voltage gain stage. Optional compensation stage 48 and optional follower stage 50 provide a compensated and buffered amplified output signal presented onto the output terminal Vout.

Figure 2:
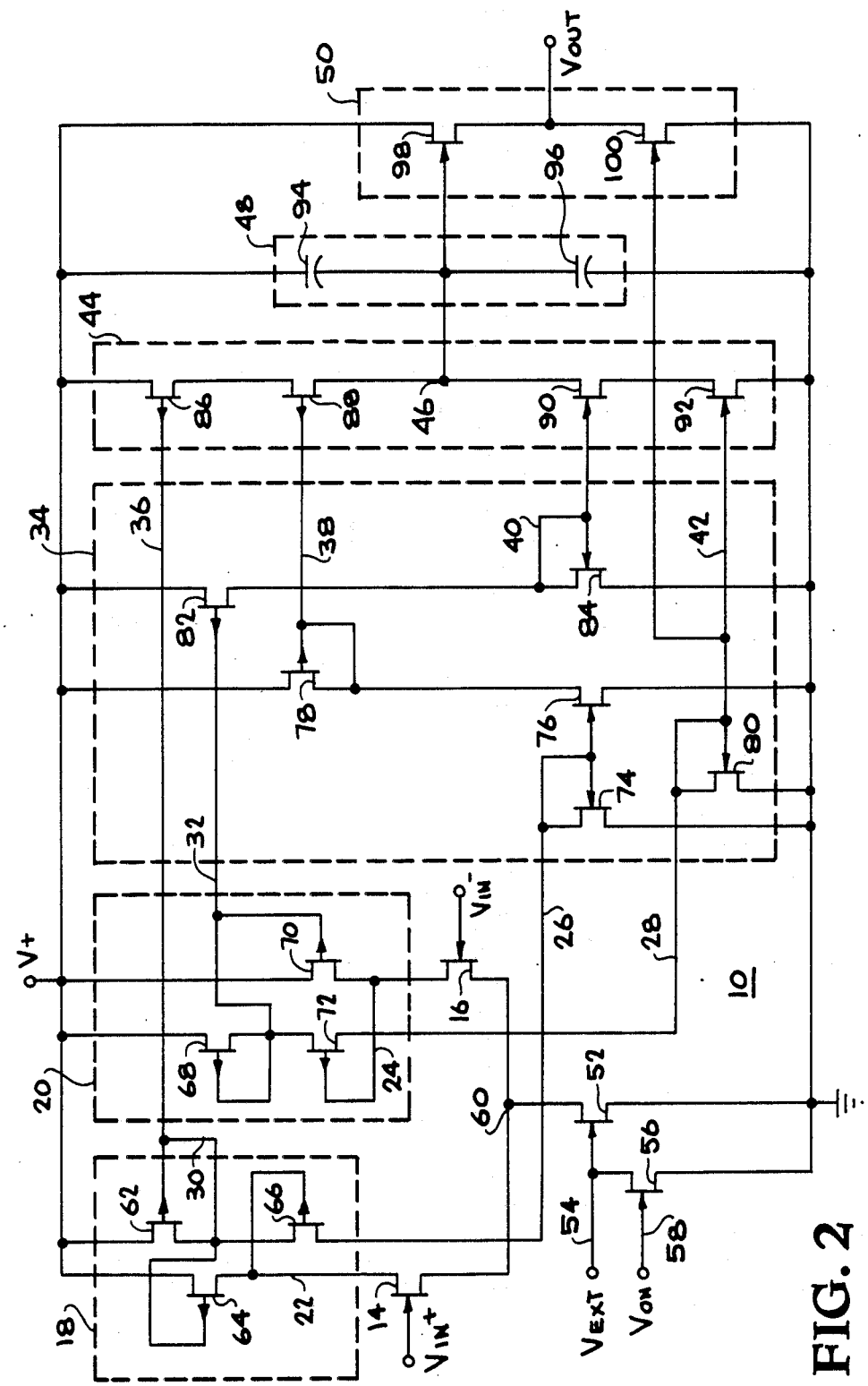
FIG. 2 is a schematic diagram of the high speed operational amplifier shown in FIG. 1.

Referring to FIGS. 1 and 2, the operational amplifier 10 is fabricated by a two micron CMOS process technology providing only two different types of transistors, P channel MOS enhancement field effect transistors and N channel MOS enhancement field effect transistors. Enhancement transistors conduct with an applied gate voltage causing an inversion conducting layer between the drain and source terminals of the transistors.

However those skilled in the art may readily appreciate the employment of different transistors, for example, depletion transistors which conduct current through a diffused conducting layer between the source and drain terminals without an applied gate voltage. Moreover, those skilled in the art may employ different process technologies used to construct similar operational amplifiers as other different embodiments of the herein disclosed invention.

P and N channel transistors are distinguished by reference arrows placed at the gate terminals thereof. A N channel MOS transistor has an arrow directed toward the gate terminal while the P channel MOS transistor has an arrow directed away from the gate terminal. The source terminal of the transistor is that terminal which is closest connected to the positive power supply reference V+ for the P channel transistor or is closest connected to the ground reference for the N channel transistors.

The preferred embodied amplifier 10 was diffused in a monolithic silicon die providing bulk terminals for the transistors. The bulk terminals are normally connected to the source terminal as is standard practice in CMOS designs.

The discussions herein relating to one particular circuit fabricated in one particular process may well be equally applicable to a wide variety of processes, and more particularly to PMOS, NMOS, CMOS and bipolar processes and equally applicable to differing devices such as junction field effect transistors, MOS enhancement field effect transistors, MOS depletion field effect transistors or PNP and NPN bipolar transistors.

The current through current source 12 is provided by a mirror transistor 52 having its drain terminal connected to the source terminals of the coupled input transistors 14 and 16. The constant current flowing through the transistor 52 is establish by applying a bias voltage on an input line 54 which is connected to a terminal Vext which is connected to an external voltage reference circuit (not shown) providing the bias voltage.

A shunt transistor 56 having its drain terminal connected to line 54, is used to turn on or off transistor 52 responsive to a voltage applied on line 58 which is connected to the gate terminal of the shunt transistor 56. An enabling and disabling signal is applied externally to a terminal Von which is connected to line 58. The transistors 56 and 52 combine to control the current flowing through the coupled input transistors 14 and 16 which in turn, control the current flowing through remaining portions of the operational amplifier 10.

The constant current which effects the speed of the operational amplifier, can be controlled or disabled providing system designs employing the operational amplifier 10 with means to automatically control or disable the operation amplifier 10. Hence, the operating current of operational amplifier 10 is externally programmed with the bias voltage to provide a choice in the tradeoff between power dissipation and speed.

The drain terminal of transistor 52 is connected to line 60 which couples together the source terminals of input transistors 14 and 16. The feedback current loads 18 and 20 are respectively connected to the drain terminals of the input transistors 14 and 16, through lines 22 and 24, respectively. Each feedback current load 18 and 20 comprise a set of three interconnecting transistors, which are current path transistor 64, mirror transistor 62 and feedback transistor 66, and current path transistor 70, mirror transistor 68 and feedback transistor 72, respectively. In substantial similar operation, both loads 18 and 20 conduct current equally but oppositely therethrough. As the current through one load increases, the current through the other decreases as an essential operation of the input differential stage 11.

The detail operation of a feedback current load is best appreciated by realizing that a gate voltage establishes a given current through a transistor. Depending upon the voltage difference between the input voltage terminals Vin+ and Vin−, a portion of the constant current through transistor 52 will flow through transistor 14 while the remaining portion flows through transistor 16. The voltage and current through lines 22 and 24 establishes the current through the loads 18 and 20, respectively, by virtue of a connection to the gate terminal of feedback transistors 66 and 70, respectively.

Referring specifically to feedback current mirror load 18, the current through transistor 14 also flows through line 22 and therefore through the current path transistor 64. The voltage on line 22 establishing a gate voltage on the gate terminal of feedback transistor 66. The gate voltage on line 22 produces a current and voltage on line 30 which is then applied to the gate terminals of the mirror transistor 62 and the current path transistor 64.

The feedback transistor 66 functions as a current source providing a current signal on line 26. Feedback within the load 18 is provided by connection of the gate terminal of feedback transistor 66 to the drain terminal of the current path transistor 64.

The feedback feature of the current load 18 and 20 reduces second order effects thereby improving the speed of the amplifier 10. Understanding of the feedback feature is best understood by way of example. In this example, the operational amplifier 10 is in a fixed bias condition having both inputs terminal connected together and to a voltage reference so that a DC current is established in both input transistor 14 and 16. Consequently, a DC current will then equally flow through both loads 18 and 20.

Again, specifically referring to load 18, in this example, a small signal positive superimposed voltage signal is coupled onto line 26. The signal produces a corresponding decrease in the current through feedback transistor 66 by virtue of the feedback transistor 66 having a conducting impedance between its source and drain terminals. This decrease in current correspondingly produces an increase in the gate voltage signal on line 30 which in turn, produces the same decrease in current through the current path transistor 64 and mirror transistor 62.

As the current through the current path transistor 64 decreases, a voltage signal on line 22 begins to increase by virtue of resistance of current path transistor 64 between the positive reference and line 22. However, transistor 14 operates to maintain the current through line 22 and in so doing, decreases the voltage on line 22 to maintain the DC current on line 22. The decreasing voltage signal on line 22 is fedback onto the gate terminal of the feedback transistor 66 causing an increasing current through the feedback transistor 66 thereby counteracting the decreasing current effects of the positive superimposed small voltage signal on line 26. In this manner, second order effects of voltage signals upon the loads 18 or 20, do not substantially effect the current or voltage outputs of the loads 18 or 20.

Current signals on lines 26 and 28 and voltage signals on lines 30 and 32 are connected to the current mirror stage 34 for level shifting, current to voltage conversion, and communication providing the cascode stage 44 with four synchronously varying voltage signals on lines 36, 38, 40, and 42. Transistors 74, 76 and 78 convert the current signal on line 26 into a corresponding voltage signal on line 38. A transistor 80 converts the current signal on line 28 into a voltage signal on line 42, which coincidentally is connected to line 28. Transistors 82 and 84 level shift the voltage signal on line 32 to another voltage signal on line 40. The voltage signal on line 30 does not require level shifting and is communicated by line 30 which is connected directly to line 36.

The cascode stage 44 has four vertically stacked transistors, a positive signal transistor 86, a positive pass transistor 88, a negative pass transistor 90 and a negative signal transistor 92, all of which are connected together in order in series between the positive power reference and the ground reference. All the transistors 86, 88, 90 and 92 have synchronously varying voltage signals applied to their respective gate terminals.

The distinction between nomenclatures of signal transistors and pass transistor is of little significance in light of the dynamic biasing of the pass transistors 88 and 90 because the biasing voltage applied to the pass transistors functions in part as a voltage signal which is amplified and presented at the output of the amplifier 10.

Load 18 is the source for the voltage signals applied to the positive transistors 86 and 88 as is the load 20 the source for the voltage signals applied to the negative transistors 90 and 92.

As the current through load 18 increases and the current through load 20 correspondingly decreases, the voltage signals on lines 36, 38, 40 and 42 synchronously decrease, as the current through transistor 86 and 88 increases and the current through transistors 90 and 92 inversely decreases. Hence, as the transistors 86 and 88 synchronously varyingly conduct, transistors 90 and 92 inversely synchronously varyingly conduct.

The dynamic biasing of the pass transistors 88 and 90 provides an increased gate to source voltage over the gate to source voltage of statically biased pass transistors. This further increase in the gate to source voltage enables the pass transistors to conduct with lower source to drain voltages thereby reducing the necessary voltage drop between the power references and the output signal, thereby increasing the dynamic range of the output signal respecting the power references which are positive reference V+ and the ground reference in this preferred embodiment. The minimum voltage between a power reference and the output signal is improved to near the gate to source threshold voltage of a single MOS transistor. The improved dynamic range enables amplification of the amplifier, in many applications, may be well suited for a single five volt power supply system.

Furthermore, the speed of the operation amplifier is further improved by the current domain operation of the amplifier. The loads 18 and 20, the current mirror stage 34 and the cascode stage 44 comprise current mirror arrangements where gates terminals of different transistors are connected together for current mirror operation characterized by large current fluxion only when needed and small voltage fluxion. The signals provided by the loads 18 and 19 are shifted, converted or communicated through mirror arrangements. The mirror current arrangements provide limited voltage swings but with possible large current swings. Therefore, Miller and parasitic effects are substantially reduced in the amplifier 10 while dissipating power only when needed.

The amplifier 10 only has one voltage gain stage between the input transistors 14 and 16 and the output terminal Vout. There are no large compensation capacitors associated with the prior art dual gain stage construction. The herein disclosed embodiment approximately has a slew rate of eighty volts per microsecond and a one percent settling time of 50 nanoseconds responding to a two volt step. The unity gain bandwidth of the amplifier is extended to fifty megahertz with a gain of fifty thousand.

The cascode stage presents an output signal on the line 46 which is optionally connected to two small 0.5 picofarad compensation capacitors 94 and 96 respectively connected to the positive reference V+ and the ground reference. The small capacitors 94 and 96 are small in size, and well suited for two micron CMOS processes, and conduct little current thereby reducing power dissipation in the cascode stage 44. The compensation capacitors 94 and 96 combine with the current domain operation of the amplifier providing a low power CMOS design, dissipating, on the average, one milliwatt.

The line 46 is optionally connected to a source follower stage 50 comprising output transistors 98 and 100. The source follower stage 50 presence a low output impedance at the output terminal Vout. The transistor 100 is dynamically bias by the voltage signal on line 42 so to improve the slew rate of the amplifier and more particularly the output follower stage 50.

The herein disclose invention encompasses a high performance amplifier with improved circuit designs enabling high speed and low power amplification. Even though, those skilled in the art may invent and conceive differing circuit and amplifier designs and modifications, those designs and modifications may nevertheless represent applications and principles within the spirit and scope of the present invention as defined by the following claims.

What is claimed is:

1. An amplifier receiving a pair of differential inputs and providing an output, comprising:

current source means providing a source of constant current, a pair of coupled transistor means each for receiving a respective one of said differential inputs, said coupled transistor means connected to said current source means, each of said pair of coupled transistor means for conducting a respective portion of said constant current in response to said differential inputs, a pair of feedback current mirror means each for conducting said portion of said current through connection to a respective one of said pair of coupoled transistor means, each of said feedback means providing voltage and current signals responsive to said differential inputs, mirror stage means formed of curent mirror arrangement for shifting, converting and communicating said voltage and current signals from said feedback current mirror means to synchronously varying voltage signals, cascode stage means for receiving said varying signals from said mirror stage means and for providing said output, said cascode stage means having a first and second portion inversely conducting current and respectively receiving a first and a second portion of said varying signals, said first and second portions of said varying signals synchronously changing respecting the other portion of said varying signals, each of said portion of said varying signals respectively driving and dynamically biasing said first and second portions of said cascode stage means, said cascode stage means including a first pair of P-channel field effect transistors for providing a first portion of an output signal at said output, said first pair of transistors being connected in series between said output and a first power supply reference supplying current and power therethrough, each of said first pair of transistors having their gate terminals connected to receive said first portion of said varying signals changing in synchronism producing changing synchronized current through said first pair of transistors, and said cascode stage means further including a second pair of N-channel field effect transistors for providing a second portion of said output signal at said output, said second pair of transistors being connected in series between said output and a second power supply reference supplying current and power therethrough, said second pair of transistors having their gate terminals connected to receive said second portion of said varying signals changing in synchronism producing inversely synchronized changing current through said second pair of transistors, said first and second portions of said varying signals synchronously changing respecting the other portion of said varying signals.

2. The amplifier of claim 1 further comprising a compensation capacitor means connected to said output for compensating said amplifier.

3. The amplifier of claim 2 wherein said compensation capacitor means comprises two capacitors connected in series between said power supply references.

4. The amplifier of claim 1 further comprising a follower stage means for buffering said output and for providing a low output impedance.

5. The amplifier of claim 4 wherein said follower stage means comprises two transistors connected together in series between said power supply references, a first one of said two transistors connected to said output and providing an output signal driven by said output, a second one of said two transistors driven by one of said signals also for providing said output signal.

6. The amplifier of claim 1 wherein each of said feedback current mirror means comprises, current path transistor means connected to said input transistor means for conducting said respective portion of said constant current, current mirror transistor means connected to said current path transistor means for conducting current equal to the current through said current path transistor means, and feedback transistor means for providing signals, said feedback transistor means connected to said current mirror transistor means and conducting the current through said current mirror transistor means, said feedback transistor means providing a feedback signal to said current path transistor means stabilizing said current through said feedback current mirror means.

7. A method of producing an output signal responsive to differential input signals comprising the steps of, determining the difference between said differential input signals, conducting respective portions of a constant current through a pair of feedback current mirror loads, shifting, converting and communicating through current mirror arrangements voltage and current signals from said feedback current mirror loads to synchronously varying voltage signals, and driving a dynamically biased cascode stage formed of a first pair of P-channel field effect transistors and a second pair of N-channel field effect transistors whose gate terminals are connected to receive said varying signals from said current mirror arrangements, said cascode stage providing said output.

8. The method of producing an output signal of claim 7, further comprising the step of compensating said output signal for stability through an operating frequency range.

9. The method of producing an output signal of claim 7, further comprising the step of following said output signal for providing a buffered output signal.

* * * * *